(12) United States Patent
Sprogies et al.

(10) Patent No.: US 11,355,446 B2
(45) Date of Patent: Jun. 7, 2022

(54) SEMICONDUCTOR CHIP SCALE PACKAGE AND METHOD

(71) Applicant: NEXPERIA B.V., Nijmegen (NL)

(72) Inventors: Tobias Sprogies, Nijmegen (NL); Jan Fischer, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 98 days.

(21) Appl. No.: 16/715,593

(22) Filed: Dec. 16, 2019

(65) Prior Publication Data
US 2020/0194377 A1     Jun. 18, 2020

(30) Foreign Application Priority Data

Dec. 17, 2018 (EP) .................................... 18212913

(51) Int. Cl.
*H01L 23/544* (2006.01)
(52) U.S. Cl.
CPC .... *H01L 23/544* (2013.01); *H01L 2223/5442* (2013.01)
(58) Field of Classification Search
CPC ... H01L 23/544; H01L 23/3114; H01L 21/561
See application file for complete search history.

(56) References Cited

U.S. PATENT DOCUMENTS

| | | | | |
|---|---|---|---|---|
| 2007/0155049 A1* | 7/2007 | Tsai | ....................... | H01L 21/561 438/106 |
| 2009/0051027 A1* | 2/2009 | Lin | ....................... | H01L 23/544 257/734 |
| 2018/0073159 A1* | 3/2018 | Curran | .................... | C25D 11/26 |
| 2018/0277488 A1* | 9/2018 | Takano | .................. | H01L 23/552 |
| 2018/0315713 A1* | 11/2018 | Roesner | ................ | H01L 23/544 |
| 2019/0131248 A1* | 5/2019 | Kong | ..................... | H01L 23/544 |
| 2019/0229064 A1* | 7/2019 | Wu | ....................... | H01L 23/3128 |

OTHER PUBLICATIONS

Partial European Search Report for corresponding application EP18212913.0, dated Jun. 27, 2019, 7 pages.
European Search Report and Written Opinion for corresponding application EP18212913.0, dated Aug. 16, 2019, 13 pages.

* cited by examiner

*Primary Examiner* — Bilkis Jahan
*Assistant Examiner* — Victor V Barzykin
(74) *Attorney, Agent, or Firm* — Ohlandt, Greeley, Ruggiero & Perle, LLP

(57) ABSTRACT

The present disclosure relates to a semiconductor chip scale package including a semiconductor die. The semiconductor die has a first major surface opposing a second major surface, a plurality of side walls extending between the first major surface and second major surface, a plurality of electrical contacts arranged on the second major surface of the semiconductor die, and an insulating material disposed on the plurality of side walls and on the first major surface. The insulating material includes a machine readable identifier by which a semiconductor chip scale packaging type is identifiable by an identification apparatus that reads the machine readable identifier, and the machine readable identifier includes a colour component.

19 Claims, 4 Drawing Sheets
(4 of 4 Drawing Sheet(s) Filed in Color)

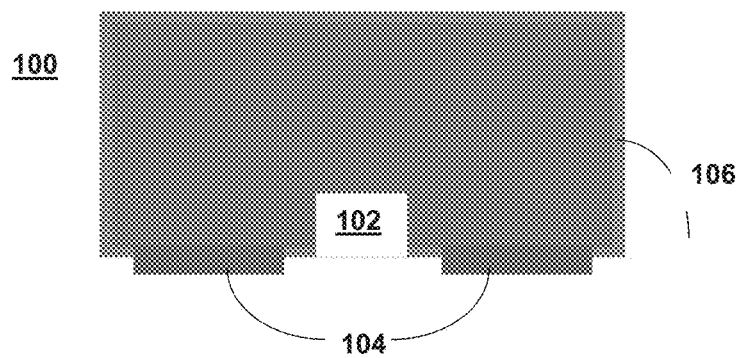
FIG. 4a
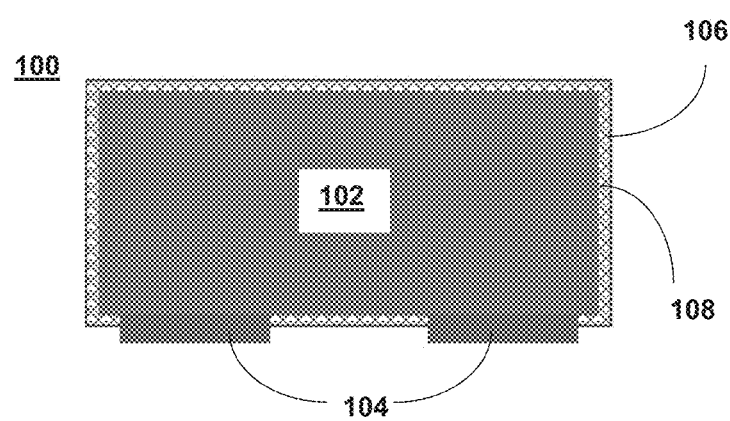
FIG. 4b
FIG. 4c
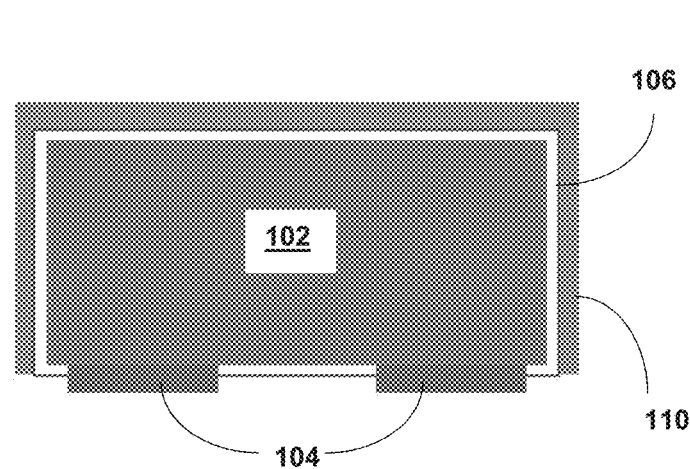

SEMICONDUCTOR CHIP SCALE PACKAGE AND METHOD

CROSS REFERENCE TO RELATED APPLICATIONS

This application claims the benefit under 35 U.S.C. § 119(a) of European Application No. 18212913.0 filed Dec. 17, 2018 the contents of which are incorporated by reference herein in their entirety.

BACKGROUND OF THE DISCLOSURE

1. Field of the Disclosure

The present disclosure relates to a semiconductor chip scale package (CSP) and method of forming a semiconductor chip scale package. More specifically, the disclosure relates a semiconductor CSP marked with a colour-coded marking to form a machine and human readable identifier and a methods of forming a semiconductor CSP with such marking.

2. Description of the Related Art

Semiconductor devices are generally manufactured and packaged as individual devices such as diodes or transistors, or as integrated circuits ICs, each integrated circuit chip typically comprising thousands or several million interconnected electrical devices fabricated on a single compact semiconductor substrate or wafer.

The fabrication of semiconductor integrated circuits may involve two processing stages: the front-end-of-line (FEOL) processing stage and the back-end-of-line (BEOL) processing stage. The FEOL covers everything up to, but not including, the deposition of metal interconnect layers. At this stage, the patterning of the individual electronic devices that form part of the integrated circuit directly onto a semiconductor substrate or wafer takes place. A process known as front-end surface engineering also occurs, which comprises the growing of surface oxides to form elements such as gate dielectrics, the patterning of such gate devices and/or any essential electronic elements, for example, channels, source and drain regions, and the implantation or diffusion of dopants to produce the suitable charge carriers in the semiconductor material required to achieve the desired device characteristics.

The BEOL processing stage commences upon completion of the FEOL processing. At this stage, electrical contacts or pads, interconnect wires, vertical electrical connections that pass through a semiconductor wafer (vias) and dielectric structures are formed. Typically, more than ten metal layers can be added to a modern IC during the BEOL process. Also included in this stage is the cutting or singulating of the finished wafer into individual semiconductor die. Each of the separated dies are then packaged for structural support, package interconnect and ingress protection. For example, the separated individual dies may be mounted on a bespoke package substrate having pins or contact pads for interconnection with other system components. Internal to the bespoke package, the contact pads on the semiconductor die are electrically connected to the contact pads within the package to complete the circuit.

A chip scale package (CSP) is an example of an integrated circuit or a discrete package that employs FEOL and BEOL processes during fabrication. In accordance with industry standards, a CSP should have a package area or footprint that is no greater than 1.2 times that of the semiconductor die encapsulated within the package and the CSP must be in the form of a single-die, direct surface-mountable package. CSPs generally have no packaging comprising an insulation material used to encapsulate and protect the semiconductor dies. The back or top portion of the device is exposed for receiving pattern marking for chip identification purposes. A pattern mark may for example include a part number, a date of manufacture, a company logo, a place of manufacture, or any other information.

Small CSPs have a relatively small surface area on the back or top exposed portion, which may make pattern marking for chip identification problematic using existing marking technologies, because there is limited space for such marking.

Known pattern marking technologies include, for example, laser ablation, photolithography or photolithography with subsequent etching. In laser ablation, a beam of a laser is focused onto a semiconductor substrate thereby breaking down the chemical bonds within the area to which the beam is applied and selectively removing material on the surface of the substrate. In laser ablation, the laser intensity, pulse length, and wavelength, as well as the semiconductor material itself, influence the amount of surface material to be removed. During microfabrication, photolithography may also be used to transfer a desired pattern marking to a film or semiconductor substrate by applying light through a photomask to a light-sensitive chemical "photoresist" on the semiconductor substrate. Both marking process are limited either by the resolution of the laser for the ablation process or by the resolution of the inspection camera at customer side.

A pattern marking on a CSP smaller than chip package size code 0603 (i.e. an approximate package dimension of 0.6 mm×0.3 mm) is limited by the resolution of the pattern processes and tools used. Small pattern markings are generally expensive and difficult to create. For example, on a 0603 product, the back or top portion of the package typically only provides an exposed area sufficient to accommodate a single patterned character using laser ablation. The variability of a single patterned character or single digit is therefore limited to approximately 26 letters and 10 numbers.

Another issue that may arise relates to the optical recognition of product pattern markings in small CSPs using optical inspection tools. Small features used in such product markings may not be of a suitable resolution that would allow an optical inspection tool to correctly read and identify a CSP product.

Aspects and embodiments of the disclosure have been devised with the foregoing in mind.

SUMMARY

According to an aspect of the present disclosure, there is provided a semiconductor chip scale package comprising: a semiconductor die, the semiconductor die comprising: a first major surface opposing a second major surface; a plurality of side walls extending between the first major surface and second major surface; a plurality of electrical contacts arranged on the second major surface of the semiconductor die; and an insulating material disposed on the plurality of side walls and on the first major surface, said insulating material comprising a machine readable identifier by which a semiconductor chip scale packaging type is identifiable by an identification apparatus that reads said machine readable identifier, wherein said machine readable identifier comprises a colour component.

This disclosure relates to colour coded marking on at least the back/top/side of a CSP. Employing colour coding in this manner may place no limitations on the resolution of any optical recognition optics (e.g. an identification apparatus for identifying a type of CSP based upon the machine readable identifier) or to any resolution of optical patterning for marking creation. A machine readable marking to allow identification of CSP type may be possible even for cases where conventional marking types (e.g. characters, or other forms of marking) would not be suitable, because such marking types would be too small to be discernible.

A spectrum of wavelengths of visible light, giving a range of colours, may be achieved using the marking method of the present disclosure. This is employed to code/label/mark a semiconductor CSP in the manner described above and hereinafter. Observation of such a spectrum, by the identification apparatus, may require a less complex apparatus than is required in prior art identification methods, where more complex apparatus may be required to read patterns and/or characters that are of a small size.

The colour-coded marking of this disclosure may also be employed in combination with, for example, pattern markings, which may increase the variability. For example, the variability may be increased to (26 letters plus 10 numbers) multiplied by applicable colours.

Optionally, the machine readable identifier may comprise a metal oxide.

Optionally, the colour component may comprise a, or the, metal oxide.

Optionally, the machine readable identifier may comprise aluminium oxide.

Optionally, the machine readable identifier may comprise titanium dioxide.

Optionally, the insulating material comprises a layer of thickness, or a plurality of layers of combined thickness: 5 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 105 nm, 110 nm, 115 nm, 120 nm, 125 nm, 130 nm, 135 nm, 140 nm, 145 nm, 150 nm, 155 nm, 160 nm, 165 nm, 170 nm, 175 nm, 180 nm, 185 nm, 190 nm, 195 nm, 200 nm, 205 nm, 210 nm, 215 nm, 220 nm, 225 nm, 230 nm, 235 nm, 240 nm, 245 nm, 250 nm, 255 nm, 260 nm, 265 nm, 270 nm, 275 nm, 280 nm, 285 nm, 290 nm, 295 nm, 300 nm, 305 nm, 310 nm, 315 nm, 320 nm, 325 nm, 330 nm, 335 nm, 340 nm, 345 nm, or 350 nm, wherein said thickness determines a colour of said colour component of said machine readable identifier. The thickness of a metal oxide layer, or thickness of multiple metal oxide layers, can provide different colours. That is, the colour of the insulating material may depend upon the thickness of the material that makes up the insulating material layer.

Optionally, the insulating material may be formed as a conformal layer on the semiconductor die by atomic layer deposition, or low temperature PECVD.

Optionally, the colour component may comprise an additive to said insulating material. Further optionally, the additive may comprise a dye, or paint.

Optionally, the colour component may comprise an additive disposed in a layer on an outer surface of the insulating material. Further optionally, the additive may comprise a dye, or paint.

Optionally, the colour component may comprise an additive disposed in a layer on an inner surface of the insulating material. Further optionally, the additive may comprise a dye, or paint.

Optionally, the colour component may be formed using surface structures formed in surfaces and/or side walls of the die. Further optionally, the surface structures may comprise optical lattices.

BRIEF DESCRIPTION OF THE DRAWINGS

"The patent or application file contains at least one drawing executed in color. Copies of this patent or patent application publication with color drawing(s) will be provided by the Office upon request and payment of the necessary fee."

For a more complete understanding of the present disclosure, reference is now made to the following description taken in conjunction with the accompanying drawings in which:

FIGS. 4a to 4e illustrate semiconductor CSPs according to one or more embodiments of the present disclosure.

DETAILED DESCRIPTION

Figure 1:
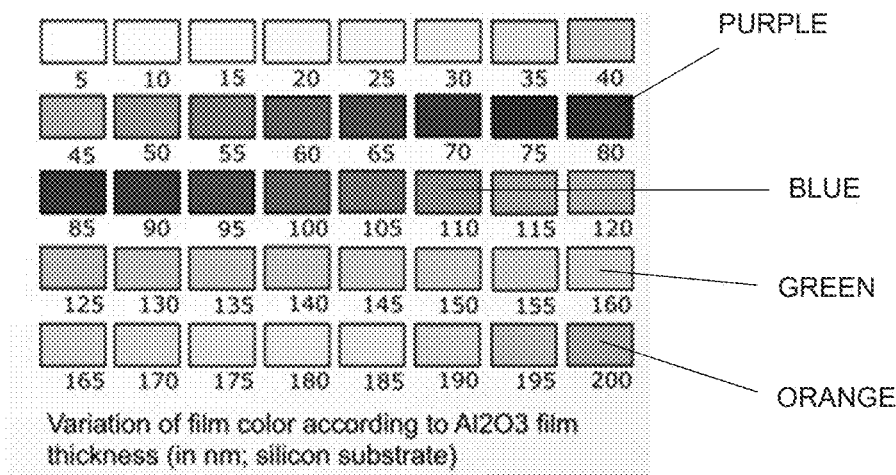
FIG. 1 illustrates a spectrum of coloured insulation material layer achievable by forming multiple layers of Aluminium Oxide ($Al_2O_3$) thin film. Thickness of insulation material layer in nm.

The claimed subject-matter provides exemplary semiconductor CSP comprising a machine readable identifier in which the identifier comprises a colour marking (i.e. a colour-coded machine readable identifier) and a method of forming a semiconductor CSP with a colour-coded machine readable identifier for the purpose of device identification. The machine readable identifier and method of forming same may also be applied to other semiconductor devices, such as, for example, bare dies or in general active semiconductor chips.

Conventional pattern marking methods impose limitations on the minimum allowable device marking dimensions, which is typically governed by the laser ablation spot size, the resolution of the optical recognition optics and/or the resolution of pattern markings. The use of colour coded marking, (i.e. by applying colour to the device surface for marking) may negate these limitations by avoiding the need to use pattern marking altogether where the device surface for marking is too small.

According to the present disclosure, colour coded marking may also be used in combination with pattern markings, for example, where the device surface for marking is sufficiently large enough to allow a single pattern marking. This may increase the marking variability to (26 letters and 10 numbers) multiplied by applicable colours.

According to the present disclosure, the application of a colour coded marking to a surface portion of a CSP may be achieved by integrated process steps during the fabrication of the CSP or by additional process steps post completion of the fabrication process of a CSP.

Integrated Process Steps Method

In the integrated process steps method, colour coded markings may be applied to CSP packaging during the fabrication process of the device at the final stage where an insulation material layer is applied to the outer surface of the CSP packaging for protective purposes by, for example, Atomic Layer Deposition (ALD). Colour coded markings may also be applied to the CSP by separately introducing colour as a by-product during the wafer separation stage by plasma dicing. During separation by plasma dicing, surface modifications are made to create optical scatter lattices. Thus, surfaces of a die, which would be encapsulated in a transparent insulation layer (to permit observation of the surfaces of the die), may be coloured, with the colour dependent upon the type of optical scatter lattice.

ALD is a thin-film deposition method where a film may be grown on a semiconductor substrate or wafer by exposing its surface to alternate gaseous species or precursors. During the CSP fabrication process, thin films may also be applied to a surface of a CSP to protect and seal the device and/or to achieve desired optical reflection properties. ALD enables a user to apply a protective layer on a surface of a CSP device while at the same time independently tune or adjust optical properties of the surface. Depending on the number of thin film layers and the material being added to the surface of the CSP during the ALD process, different colours may be achieved on the surface of the CSP. A detailed discussion of specific ALD processes is not within the scope of the present disclosure as the skilled person will be aware that ALD processes may allow for deposition of near perfect layers by sequential self-limiting surface reactions.

According to one or more embodiments, an aluminium oxide may be deposited on a surface of a CSP by ALD to form an insulation material layer of a fixed thickness (e.g. 65 nm thick) to produce a CSP having a specific colour coded marking on the outer surface, in this case, the colour brown. According to further embodiments, by varying the thickness of the deposited insulation material layer comprising the aluminium oxide, different insulation material layers with different colour coded markings may be achieved as illustrated in FIG. 1. For example, four easily distinguishable coloured thin films: purple, blue, green and orange may be produced with $Al_2O_3$ of thicknesses: 80 nm, 110 nm, 160 nm and 200 nm respectively.

An insulation material layer with colour coded marking may also be achieved by mixing aluminium oxide with other materials such as titanium oxide. $Al_2O_3$ alone may be corroded by moisture, therefore the inclusion of the $TiO_2$ layer improves corrosion resistance because $TiO_2$ is chemically more stable than $Al_2O_3$. According to one or more embodiments, an insulation material layer by be formed of one or more bi-layers of aluminium oxide and titanium oxide. Colour coded marking may be achieved on such an insulation material layer by first applying an aluminium oxide thin film layer on a surface of the CSP and then applying a titanium oxide thin film layer over the first layer to form a bi-layer. Identical bi-layers may then be repeatedly deposited over the first bi-layer to build up an insulating material layer of a desired thickness to achieve an insulation material later with a required colour coded marking. The stacking order of the metal oxides may also vary such that, for example, the first thin film layer applied on the surface of the CSP may be titanium oxide and the second thin film layer may be aluminium oxide. Any suitable metal oxides alone or in combination may also be used other than aluminium and titanium oxide to achieve insulation material layers with colour coded markings. The deposited layer of oxide material may be of any suitable thickness to achieve a desired colour coded marking. The colour is determined by the sum of thicknesses of all deposited layers, which includes a protection layer.

The typical range of the insulating material layer thickness may be in the range of 1 nm to 350 nm such that a wide spectrum of colour coded markings can be achieved, and the requirement of total package volume is maintained as nearly identical to the volume of the die.

Figure 2:
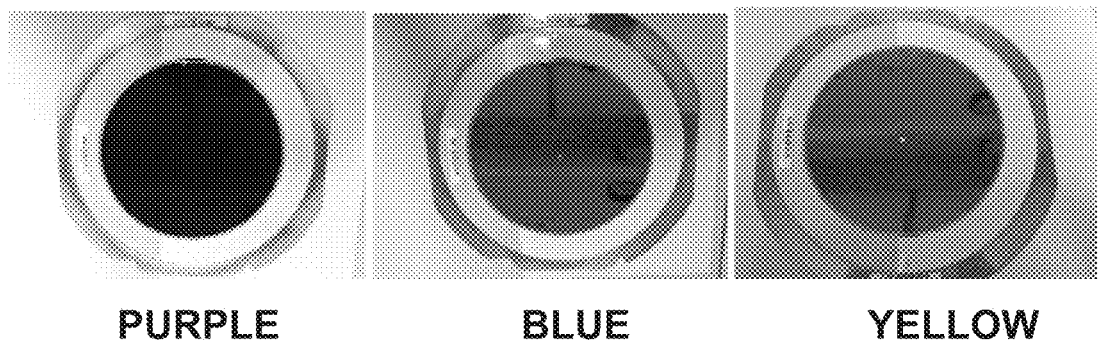
FIG. 2 illustrates three semiconducting wafers with three different colour coded markings, sawn on frame, each wafer comprising approximately 300,000 semiconductor devices (0402 sized), the colour coded marking achieved by forming insulation layers of different thickness comprising Aluminium Oxide ($Al_2O_3$) and Titanium Dioxide ($TiO_2$)
Figure 3:
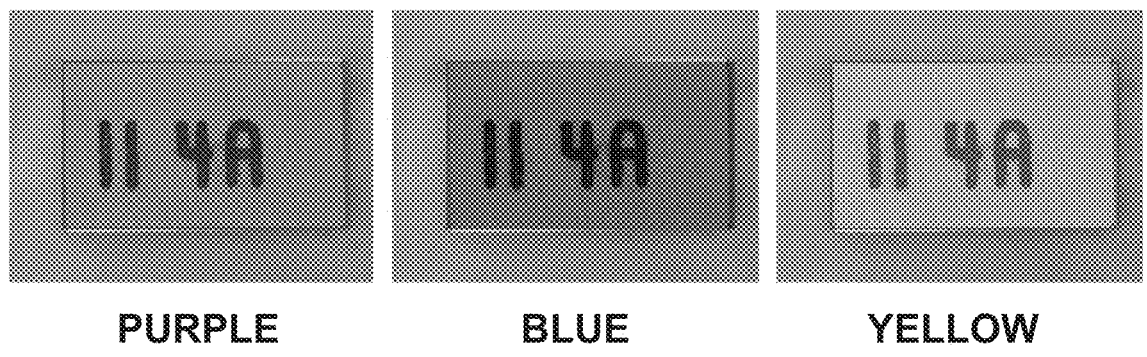
FIG. 3 illustrates three sample CSP devices (1006 sized) with colour coded markings respective to the semiconductor devices illustrated in FIG. 2. The sample CSP devices have also been marked using conventional laser marking.

For illustrative purposes, FIG. 2 shows three different colour coded semiconducting wafers produced in accordance with the method set out in the preceding paragraphs. Each wafer comprises approximately 300 devices (i.e. 0402 sized). The colouring of a top surface of these wafers may be achieved by stacking multiple bi-layers of titanium oxide $TiO_2$ and aluminium oxide $Al_2O_3$ using the ALD process. For illustrative purposes, FIG. 3 shows conceptual views of three finished CSP products (1006 sized), each comprising one of the three wafer examples with colour coded markings shown in FIG. 2.

To achieve a "purple" colour, an insulating layer comprising $Al_2O_3$ and $TiO_2$ with a thickness of 50 nm may be employed. To achieve a "blue" colour, an insulating layer comprising $Al_2O_3$ and $TiO_2$ with a thickness of 100 nm may be employed. To achieve a "yellow" colour, an insulating layer comprising $Al_2O_3$ and $TiO_2$ with a thickness of 150 nm may be employed.

In the integrated process step method, additional to the ALD process, colour coded marking may also be applied to the CSP as a by-product during plasma dicing. Plasma dicing is a process used for cutting or singulating wafers, i.e. separation of wafers during fabrication.

There are two methods using plasma dicing for separation, called "grinding before dicing" (GBD) and "dicing before grinding" (DBG). Both methods are also adoptable to blade dicing, which is more common, A common process for Plasma dicing is called "Bosch process". This dry etching process creates a scalloped sidewall on a die, which may work as an optical grid by the formed grooves parallel to one of the two major surfaces called back side or front side. In dependency of the size of the grooves and the incident angle of the incident light, the surface appears coloured.

Plasma dicing employs a dry etching process that makes use of fluorine chemistry. Unlike blade dicing, where contact is made between a blade and the wafer during cutting which may lead to the wafer chipping or cracking, no physical contact is made with plasma dicing. In addition, unlike blade dicing which require more blade processing time to perform more cut lines, the dicing process time for plasma dicing remains more or less the same regardless of the chip size. Plasma is therefore suited for cutting micro-sized chips of 500 μm square or smaller.

A by-product of plasma dicing is the formation of multi-coloured strips on the semiconductor wafer surface during the singulating process. That is, walls of the CSP may appear multi coloured, because of some slight process variation and grooves/stripes.

Additional Process Steps Method

In the additional process steps method, colour coded marking may be applied to the CSP device after completion of the fabrication of the CSP device or semiconductor wafer. During the final fabrication process step of the CSP, an insulation material layer is applied to the outer packaging of the CSP device to encapsulate and protect the semiconductor die within the device. When this process is completed, separate or additional fabrication process steps may be performed to apply colour coded marking on top of the insulation material. The colour coded marking may be a type of paint, a dye, etc.

FIG. 4a illustrates a semiconductor CSP 100 comprising a semiconductor die 102 and a plurality of electrical contacts 104. The die 102 is encapsulated in an insulating layer 106, which comprises a metal oxide, such as, for example, $Al_2O_3$, $TiO_2$, or a combination of the two. A colour of the insulating layer 106 is dependent upon the thickness of the $Al_2O_3$ or $TiO_2$ layers, or the sum of the thicknesses of $Al_2O_3$ and $TiO_2$ layers (where both materials are present).

FIG. 4b illustrates a semiconductor CSP 100 comprising a semiconductor die 102 and a plurality of electrical contacts 104. The die 102 is encapsulated in an insulating layer 106, which comprises an additive. The additive comprises a colouring additive that provides a colour component to the insulating layer 106.

FIG. 4c illustrates a semiconductor CSP 100 comprising a semiconductor die 102 and a plurality of electrical contacts 104. The die 102 is encapsulated in an insulating layer 106, an outer surface of which is coated with a layer 108 containing an additive. The additive comprises a colouring additive that provides a colour component to the insulating layer 106.

Figure 4D:
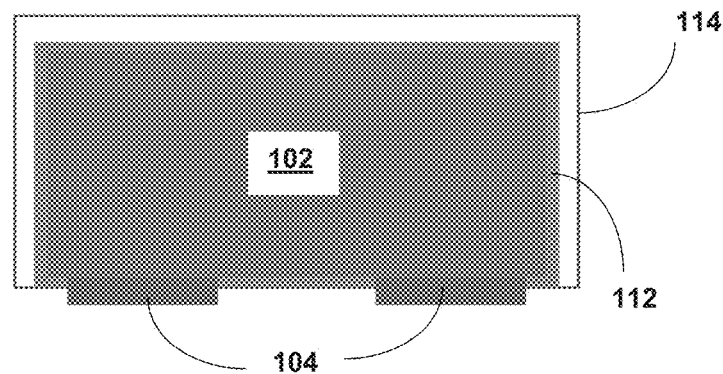

FIG. 4d illustrates a semiconductor CSP 100 comprising a semiconductor die 102 and a plurality of electrical contacts 104. The die 102 is encapsulated in a layer 112 containing an additive. The additive comprises a colouring additive that provides a colour component to the layer 112. A transparent insulating layer 114 surrounds the layer 112 and allows the underlying layer 112 to be observed.

Figure 4E:
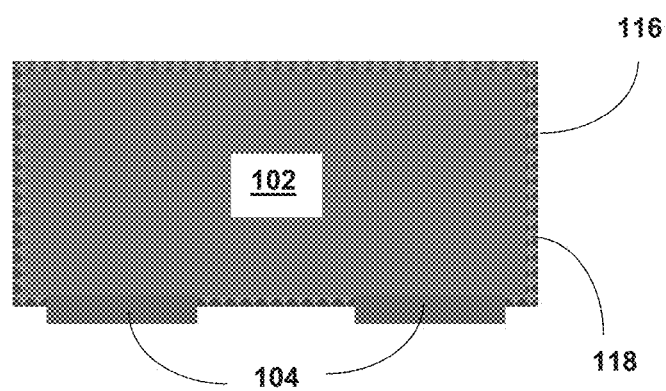

FIG. 4e illustrates a semiconductor CSP 100 comprising a semiconductor die 102 and a plurality of electrical contacts 104. The die 102 is encapsulated in an insulating layer 116, which comprises surface formations 118 in an outer surface thereof. These surface formations provide a colour component. Optionally, the surface formations 118 comprise optical lattices.

Particular and preferred aspects of the disclosure are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed disclosure or mitigate against any or all of the problems addressed by the present disclosure. The applicant hereby gives notice that new claims may be formulated to such features during prosecution of this application or of any such further application derived there from. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

Term "comprising" does not exclude other elements or steps, the term "a" or "an" does not exclude a plurality. Reference signs in the claims shall not be construed as limiting the scope of the claims.

What is claimed is:

1. A semiconductor chip scale package comprising:
    a semiconductor die, the semiconductor die comprising: a first major surface opposing a second major surface and a plurality of side walls extending between the first major surface and second major surface;
    a plurality of electrical contacts arranged on the second major surface of the semiconductor die;
    an insulating material disposed on the plurality of side walls and on the first major surface; and
    a layer comprising a machine readable identifier by which a semiconductor chip scale packaging type is identifiable by an identification apparatus that reads the machine readable identifier, wherein the machine readable identifier further comprises a colour-coded colour component on the plurality of side walls and the first major surface.

2. The semiconductor chip scale package according to claim 1, wherein the layer including the machine readable identifier is an insulating layer comprising the insulating material.

3. The semiconductor chip scale package according to claim 2, wherein the machine readable identifier further comprises a metal oxide.

4. The semiconductor chip scale package according to claim 2, wherein the colour-coded colour component further comprises a metal oxide.

5. The semiconductor chip scale package according to claim 3, wherein the colour-coded colour component further comprises a metal oxide.

6. The semiconductor chip scale package according to claim 2, wherein the machine readable identifier further comprises aluminium oxide.

7. The semiconductor chip scale package according to claim 2, wherein the machine readable identifier further comprises titanium dioxide.

8. The semiconductor chip scale package according to claim 6, wherein the insulating layer further comprises one or more layers having a total thickness, wherein the total thickness of the insulating layer is selected from the group consisting of 5 nm, 10 nm, 15 nm, 20 nm, 25 nm, 30 nm, 35 nnm, 40 nm, 45 nm, 50 nm, 55 nm, 60 nm, 65 nm, 70 nm, 75 nm, 80 nm, 85 nm, 90 nm, 95 nm, 100 nm, 105 nm, 110 nm, 115 nm, 120 nm, 125 nm, 130 nm, 135 nm, 140 nm, 145 nm, 150 nm, 155 nm, 160 nm, 165 nm, 170 nm, 175 nm, 180 nm, 185 nm, 190 nm, 195 nm, 200 nm, 205 nm, 210 nm, 215 nm, 220 nm, 225 nm, 230 nm, 235 nm, 240 nm, 245 nm, 250 nm, 255 nm, 260 nm, 265 nm, 270 nm, 275 nm, 280 nm, 285 nm, 290 nm, 295 nm, 300 nm, 305 nm, 310 nm, 315 nm, 320 nm, 325 nm, 330 nm, 335 nm, 340 nm, 345 nm, and 350 nm; and wherein the total thickness of the insulating layer determines a colour of the colour-coded colour component of the machine readable identifier.

9. The semiconductor chip scale package according to claim 6, wherein the insulating layer comprises one or more layers having a total thickness of from 5 nm to 350 nm, and wherein the total thickness of the insulating layer determines a colour of the colour-coded colour component of the machine readable identifier.

10. The semiconductor chip scale package according to claim 7, wherein the insulating layer comprises one or more layers have a total thickness of from 5 nm to 350 nm, and wherein the total thickness of the insulating layer determines a colour of the colour-coded colour component of the machine readable identifier.

11. The semiconductor chip scale package according to claim 2, wherein the insulating material is formed as a conformal layer on the semiconductor die by atomic layer deposition, or low temperature PECVD.

12. The semiconductor chip scale package according to claim 2, wherein the colour-coded colour component further comprises an additive to the insulating material.

13. The semiconductor chip scale package according to claim 12, wherein the additive further comprises a dye, or paint.

14. The semiconductor chip scale package according to claim 1, wherein the layer is disposed on an outer surface of the insulating material, and wherein:
the layer comprises the colour-coded colour component, and the colour-coded colour component further comprises an additive.

15. The semiconductor chip scale package according to claim 14, wherein the additive further comprises a dye, or a paint.

16. The semiconductor chip scale package according to claim 1, wherein the layer is disposed on an inner surface of the insulating material, and the layer comprises the colour-coded colour component, and wherein the colour-coded component further comprises an additive.

17. The semiconductor chip scale package according to claim 16, wherein the additive further comprises a dye, or paint.

18. The semiconductor chip scale package according to claim 1, wherein the colour-coded colour component is formed using surface structures formed in surfaces and/or side walls of the die.

19. The semiconductor chip scale package according to claim 18, wherein the surface structures further comprise optical lattices.

* * * * *